United States Patent
Kiehl et al.

(10) Patent No.: US 6,765,826 B2
(45) Date of Patent: Jul. 20, 2004

(54) WRITE PROTECTION CONTROL FOR ELECTRONIC ASSEMBLIES

(75) Inventors: Oliver Kiehl, Charlotte, VT (US); Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 10/226,684

(22) Filed: Aug. 23, 2002

(65) Prior Publication Data

US 2003/0058703 A1 Mar. 27, 2003

(30) Foreign Application Priority Data

Aug. 23, 2001  (DE) .......................................... 101 41 484

(51) Int. Cl.$^7$ .............................................. G11C 16/04
(52) U.S. Cl. ............................. 365/185.04; 365/185.05; 365/189.04; 365/189.05; 365/201; 365/228

(58) Field of Search ..................... 365/185.04, 185.05, 365/189.04, 189.05, 228, 201

(56) References Cited

U.S. PATENT DOCUMENTS

| | | | |
|---|---|---|---|
| 5,594,686 A | * | 1/1997 | Hazen et al. .......... 365/185.04 |
| 5,661,677 A | | 8/1997 | Rondeau, II et al. |
| 5,777,930 A | * | 7/1998 | Sugiura et al. ........ 365/189.11 |
| 5,854,762 A | * | 12/1998 | Pascucci ................ 365/185.04 |
| 5,859,792 A | | 1/1999 | Rondeau, II et al. |

* cited by examiner

*Primary Examiner*—Connie C. Yoha
(74) *Attorney, Agent, or Firm*—Laurence A. Greenberg; Werner H. Stemer; Gregory L. Mayback

(57) ABSTRACT

The invention relates to an electronic assembly having a non-volatile memory device with a controllable write protection feature and a switching configuration for generating a write protection signal from potentials at the supply terminals of the electronic assembly.

11 Claims, 1 Drawing Sheet

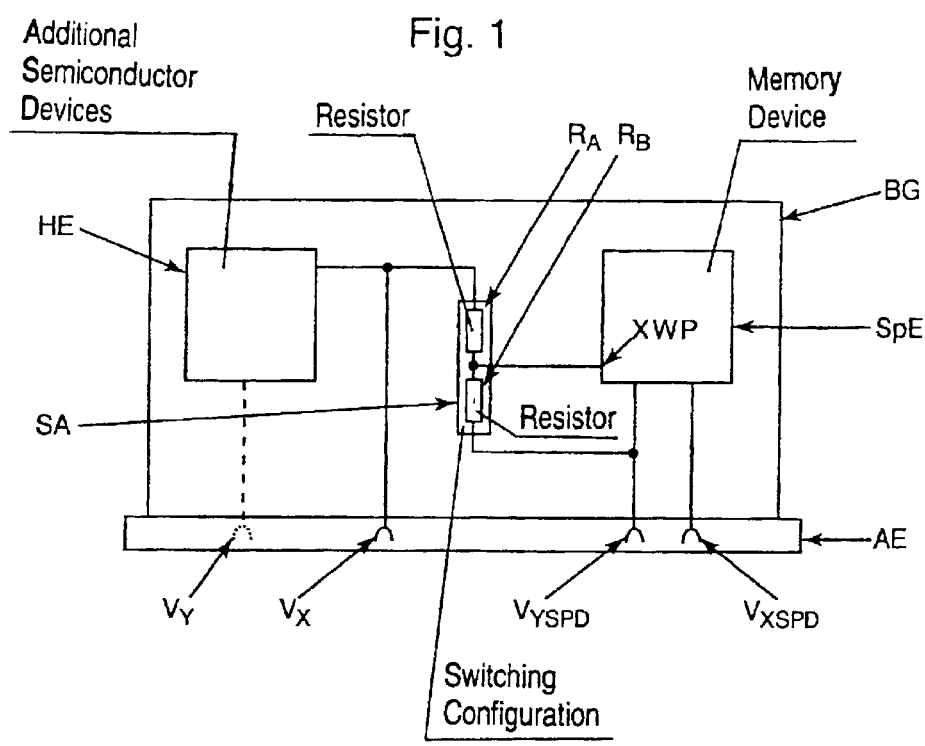

WRITE PROTECTION CONTROL FOR ELECTRONIC ASSEMBLIES

BACKGROUND OF THE INVENTION

Field of the Invention

The present invention relates to an electronic assembly with at least one non-volatile memory device that includes a controllable write protect terminal.

Configuration data and operating parameters of electronic assemblies are often stored in non-volatile memory devices located on the assemblies. These non-volatile memory devices are programmed with configuration data and operating parameters at a test location at the factory before the assembly is mounted in a target system. In the target system, the operating parameters and the configuration data are read by a higher-ranking unit of the target system. But they usually must not be modified in the target system.

EEPROMs (Electrically Erasable Programmable Read Only Memories) are customarily utilized as such non-volatile memory devices. Such EEPROMs can be repeatedly written to. EEPROMs are usually capable of one of two methods of preventing unintentional or unauthorized writing.

The first possibility is to protect the contents of the EEPROM against further writing by using a special programming mode.

The second common method of protecting commercial EEPROMs against unauthorized writing involves a write protect terminal. The contents of the EEPROM are protected against overwriting as long as a first signal at the write protect terminal has a level which activates the write protection. Writing is possible only when the signal at the write protect terminal is the inverse of the first signal. The write protect terminal can be high-active or low-active.

For storing the data of a recent maintenance or data for reconfiguring the assembly, operating parameters and configuration data must be kept on an electronic assembly in a reparameterizable form.

On the other hand, any modification of these data in the target system must be prevented. Misoperations or, when the target system is a computer, viruses may render the assembly unusable for long periods of time or may damage the computer by overwriting these data.

Hitherto the write protection of non-volatile memory devices on electronic assemblies has been handled according to one of the following methods:

An operating system in the target system provides for a programming operation in the non-volatile memory devices with each startup operation of the target system. This programming operation prevents further writing of the non-volatile memory devices. All unwanted write operations in the target system are thus prevented, but possible wanted write operations at a test location outside the target system are also prevented.

According to other proposals (U.S. Pat. No. 5,661,677 and U.S. Pat. No. 5,859,792), the write protect terminal of the non-volatile memory device is connected temporarily or permanently to a special terminal of the assembly. The overwriting of the data of the non-volatile memory device in the target system can be prevented by connecting this special terminal in the target system to a potential that activates the write protection. At another mounting location, for instance, at the test device, a potential that deactivates the write protection is applied at this terminal. Operating parameters and configuration data are protected in the target system and are reparameterizable outside the target system. The disadvantage of this possibility is the fact that an additional special terminal for operating the write protection is needed at the assembly.

In order to guarantee the operating reliability of the target system, the previous methods for handling the write protection on non-volatile memory devices thus require either that the reparameterizability of the electronic assembly be forgone or that an additional special terminal be provided on this assembly.

SUMMARY OF THE INVENTION

It is accordingly an object of the invention to provide an electronic assembly with a non-volatile memory device and a method for writing to a non-volatile memory device with a write protect terminal which overcomes the above-mentioned disadvantages of the prior art apparatus and methods of this general type.

In particular, it is an object of the invention to provide write protection for non-volatile memory devices on electronic assemblies, such that the non-volatile memory devices that are write-protected in a target system can be written to at a test location.

With the foregoing and other objects in view there is provided, in accordance with the invention, an electronic assembly, in combination with a target system and a test location. The electronic assembly includes: at least one non-volatile memory device having a write protection feature and a controllable write protection terminal for activating and deactivating the write protection feature; at least one additional semiconductor device; a terminal device including at least one pair of supply terminals for supplying the non-volatile memory device and at least one third supply terminal for supplying the additional semiconductor device when the electronic assembly is being operated in the target system; a first signal path; and a switching configuration connecting the write protect terminal of the non-volatile memory device to the third supply terminal over the first signal path. The third supply terminal provides a potential for activating the write protection feature when the electronic assembly is being operated in the target system. The write protection feature is deactivatable when the electronic assembly is being operated at the test location.

In accordance with an added feature of the invention, the switching configuration includes a permanent connection.

In accordance with an additional feature of the invention, the switching configuration connects the write protection terminal of the non-volatile memory device over a second signal path to a first one of the pair of the supply terminals; and the write protection feature is deactivated by a potential on the first one of the pair of the supply terminals.

In accordance with another feature of the invention, the switching configuration includes at least one component for interrupting the first signal path or the second signal path.

In accordance with a further feature of the invention, the switching configuration includes passive elements with connections; and the passive elements derive valid signal levels for activating and deactivating the write protection feature from potentials at the supply terminals.

In accordance with a further added feature of the invention, the switching configuration includes active elements; and the active elements derive valid signal levels for activating and deactivating the write protection feature from potentials at the supply terminals.

In accordance with yet an added feature of the invention, the non-volatile memory device is an EEPROM.

In accordance with yet an additional feature of the invention, the electronic assembly is a memory module.

With the foregoing and other objects in view there is provided, in accordance with the invention, a method for writing to at least one non-volatile memory device having a write protection feature and a controllable write protection terminal. The method includes steps of:

(a) providing the non-volatile memory device on an electronic assembly having at least one pair of supply terminals for supplying the non-volatile memory device, at least a third supply terminal, and a switching configuration;

(b) mounting the assembly at a test location;

(c) at the test location, driving the third supply terminal of the assembly in a particular way such that the switching configuration generates a signal that deactivates the write protection feature;

(d) writing to the memory device;

(e) mounting the assembly in a target system;

(f) in the target system, feeding-in a potential at the third supply terminal of the assembly, from which the switching configuration generates a signal that activates the write protection feature; and (g) frequently repeating steps (a) to (f).

In accordance with an added mode of the invention, the method includes steps of: at the test location, feeding-in a potential at the third supply terminal; andusing the switching configuration to generate, from the potential that is fed in at the third supply terminal, a signal that deactivates the write protection feature.

In accordance with an additional mode of the invention, the method includes steps of: at the test location, discontinuing the driving of the third supply terminal; feeding-in potentials at the supply terminals of the memory device; and using the switching configuration to generate, from one of the potentials that are fed-in at the supply terminals, a signal that deactivates the write protection feature.

By using an inventive switching configuration on the electronic assembly, a signal for controlling the write protection (write protect signal) of a non-volatile memory device is derived from existing supply lines of the electronic assembly. With the inventive method, the non-volatile memory device can be written to at a test location outside of the target system without requiring that additional terminals be provided on the electronic assembly.

The inventive embodiment of the switching configuration, which advantageously consists of a fixed connection, derives the write protect signal from a third supply terminal of the assembly. This third supply terminal is provided in addition to the two terminals needed for supplying the non-volatile storage unit.

In the event that the electronic assembly is mounted in a target system, the switching configuration generates a write protect potential from the potential that is fed in at the third supply terminal. This write protect potential activates the write protection At a test location outside the target system, a potential that deviates from this can be applied at this additional supply terminal, from which the switching configuration generates a signal which deactivates the write protection.

In an expanded embodiment of the invention, the write protect terminal is suitably connected to the supply terminal of the two supply terminals of the non-volatile memory device whose potential is equivalent to the signal level for deactivating the write protection.

The behavior of the write protection of the non-volatile memory device in the target system remains unaffected by this. The expanded embodiment of the invention generates the signal that is needed for deactivating the write protection, at a test location, directly from the supply potential of the non-volatile memory device as long as no potential is fed in at the third supply terminal. This third supply terminal can remain released for writing the non-volatile memory device at the test location.

The inventive switching configuration transforms the potential at the third supply terminal into a permissible signal level at the write protect terminal of the non-volatile memory device.

In the simplest case, the level of the potential at the third supply terminal corresponds to a permissible signal level for activating the write protection at the non-volatile memory device. In this case, the switching configuration consists of an ohmic resistance in the connection between the third supply terminal of the assembly and the write protect terminal of the non-volatile memory device.

If the potential at the additional supply terminal is lower than the signal level that activates the write protection, a level conversion occurs by using an active component such as a transistor.

If the potential at the third supply terminal is above a permissible signal level for activating the write protection, the level is converted either passively by a resistance divider or by an active level converter that potentially may be an inverter.

Another embodiment of the switching configuration contains components by which the connection between the third supply terminal of the assembly and the write protect terminal of the non-volatile memory device is produced first at the test location and/or in the target system. Such components may be fuses or bridges that are inserted at the test location and removed in the target system, or switches.

The same applies to the realization of the connection between the write protect terminal of the non-volatile memory device and one of its supply terminals.

In general, the non-volatile memory device will consist of EEPROMs or PROMs (Programmable Read Only Memory).

Storage assemblies for processor boards, electronic assemblies, calculators, and computers are particularly advantageous electronic assemblies to utilize for inventively controlling the write protection.

Other features which are considered as characteristic for the invention are set forth in the appended claims.

Although the invention is illustrated and described herein as embodied in a write protection control for electronic assemblies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows an electronic assembly with a non-volatile memory device.

DESCRIPTION OF THE PREFERRED EMBODIMENTS

Referring now to the sole FIGURE of the drawing, there is shown an electronic assembly BG with a non-volatile memory device SpE on it. The representation is limited to the components, terminals and connections that are essential for understanding the invention.

A terminal device AE of the assembly contains terminals $V_{XSPD}$ and $V_{YSPD}$ for supplying the non-volatile memory device SpE. The terminal device AE includes an additional third supply terminal $V_X$ which, along with a fourth supply terminal $V_Y$, is typically needed for supplying additional semiconductor devices HE on the assembly BG.

A switching configuration SA connects the additional supply terminal $V_X$ to a write protect terminal XWP of the non-volatile memory configuration SpE. In this exemplary embodiment, the switching configuration SA also connects the write protect terminal XWP of the non-volatile memory device SpE to the supply terminal $V_{YSPD}$. The signal levels for activating and deactivating the write protection are extracted from the potentials at $V_X$ and $V_{YSPD}$.

In a particularly preferred embodiment, the electronic assembly BG is a memory module for a processor board, and the non-volatile memory device SpE is an EEPROM.

Such standard memory modules, which are equipped with DDR-SDRAMs (Double Data Rate Synchronous Dynamic Random Access Memories), include three substantially independent pairs of supply voltages, $V_{DD}/V_{SS}$, $V_{DDQ}/V_{SSQ}$ and $V_{DDSPD}/V_{SSSPD}$. The supply voltages $V_{DDSPD}/V_{SSSPD}$ power the EEPROM on the standard memory module, which contains the typical operating parameters of the assembly such as its memory size and organization and its electrical features, and which is programmed on the factory side before the assembly is mounted in a target system.

On such standard memory modules, the potential at $V_{DDSPD}$ is typically equal to the potential at $V_{DD}$, and the potential at $V_{SSSPD}$ typically equals the potential $V_{SS}$, accordingly.

If the write protect terminal XWP at the EEPROM SpE is high-active, then it is connected across a high impedance (10 kiloohms to 10 megaohms) to the terminal $V_{DD}$ on the assembly in this embodiment.

In the target system, the potential that is fed in at $V_{DD}$ is positive and activates the write protection in the EEPROM SpE across a resistance $R_A$. If the EEPROM SpE is written to at a test location, a negative potential is fed in at $V_{DD}$ during the write operation, and the write protection is thereby deactivated.

If the high-active write protect terminal XWP of the EEPROM is additionally connected to the negative supply potential of the EEPROM $V_{SSSPD}$ across a resistance $R_B$ whose value is higher than the resistance value of the resistance $R_A$ by approximately a factor of 10, then in the target system the write protection across $V_{DD}$ remains activated, while at the test location the write protection across $R_B$ is deactivated. Then it is not necessary to feed in a negative potential at $V_{DD}$ during the writing of the EEPROM. The resistances $R_A$ and $R_B$ can have values from near zero ohms practically to infinity.

We claim:

1. An electronic assembly, in combination with a target system and a test location, the electronic assembly comprising:
   at least one non-volatile memory device having a write protection feature and a controllable write protection terminal for activating and deactivating the write protection feature;
   at least one additional semiconductor device;
   a terminal device including at least one pair of supply terminals for supplying said non-volatile memory device and at least one third supply terminal for supplying said additional semiconductor device when the electronic assembly is being operated in the target system;
   a first signal path; and
   a switching configuration connecting said write protect terminal of said non-volatile memory device to said third supply terminal over said first signal path;
   said third supply terminal providing a potential for activating the write protection feature when the electronic assembly is being operated in the target system; and
   the write protection feature being deactivatable when the electronic assembly is being operated at the test location.

2. The electronic assembly according to claim 1, wherein: said switching configuration includes a permanent connection.

3. The electronic assembly according to claim 1, comprising:
   a second signal path;
   said switching configuration connecting said write protection terminal of said non-volatile memory device over said second signal path to a first one of said pair of said supply terminals; and
   the write protection feature being deactivated by a potential on said first one of said pair of said supply terminals.

4. The electronic assembly according to claim 3, wherein: said switching configuration includes at least one component for interrupting a signal path selected from said first signal path and said second signal path.

5. The electronic assembly according to claim 1, wherein:
   said switching configuration includes passive elements with connections; and
   said passive elements derive valid signal levels for activating and deactivating the write protection feature from potentials at said supply terminals.

6. The electronic assembly according to claim 1, wherein:
   said switching configuration includes active elements; and
   said active elements derive valid signal levels for activating and deactivating the write protection feature from potentials at said supply terminals.

7. The electronic assembly according to claim 1, wherein: said non-volatile memory device is an EEPROM.

8. A memory module, in combination with a target system and a test location, the memory module comprising:
   at least one non-volatile memory device having a write protection feature and a controllable write protection terminal for activating and deactivating the write protection feature;
   at least one additional semiconductor device;
   a terminal device including at least one pair of supply terminals for supplying said non-volatile memory device and at least one third supply terminal for supplying said additional semiconductor device when the memory module is being operated in the target system;
   a first signal path; and
   a switching configuration connecting said write protect terminal of said non-volatile memory device to said third supply terminal over said first signal path;
   said third supply terminal providing a potential for activating the write protection feature when the memory module is being operated in the target system; and the write protection feature being deactivatable when the memory module is being operated at the test location.

9. A method for writing to at least one non-volatile memory device having a write protection feature and a controllable write protection terminal, which comprises:

(a) providing the non-volatile memory device on an electronic assembly having at least one pair of supply terminals for supplying the non-volatile memory device, at least a third supply terminal, and a switching configuration;

(b) mounting the assembly at a test location;

(c) at the test location, driving the third supply terminal of the assembly in a particular way such that the switching configuration generates a signal that deactivates the write protection feature;

(d) writing to the memory device;

(e) mounting the assembly in a target system;

(f) in the target system, feeding-in a potential at the third supply terminal of the assembly, from which the switching configuration generates a signal that activates the write protection feature; and (g) frequently repeating steps (a) to (f).

10. The method according to claim 9, which comprises:

at the test location, feeding-in a potential at the third supply terminal; and using the switching configuration to generate, from the potential that is fed in at the third supply terminal, a signal that deactivates the write protection feature.

11. The method according to claim 9, which comprises:

at the test location, discontinuing the driving of the third supply terminal;

feeding-in potentials at the supply terminals of the memory device; and using the switching configuration to generate, from one of the potentials that are fed-in at the supply terminals, a signal that deactivates the write protection feature.

* * * * *